(12) United States Patent
Rothenberg et al.

(10) Patent No.: US 8,072,709 B2
(45) Date of Patent: Dec. 6, 2011

(54) FLEX CABLE FOR A HARD DISK DRIVE HAVING AN INTERROGATION TRACE

(75) Inventors: Edgar D. Rothenberg, San Jose, CA (US); Jr-Yi Shen, Sunnyvale, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 597 days.

(21) Appl. No.: 12/266,715

(22) Filed: Nov. 7, 2008

(65) Prior Publication Data

US 2010/0118444 A1 May 13, 2010

(51) Int. Cl.
*G11B 21/16* (2006.01)
*H05K 1/00* (2006.01)

(52) U.S. Cl. ........ 360/245.9; 174/254; 439/77; 439/492

(58) Field of Classification Search ................ 360/245.9
See application file for complete search history.

(56) References Cited

U.S. PATENT DOCUMENTS

| | | | |
|---|---|---|---|
| 4,906,803 A * | 3/1990 | Albrechta et al. | 174/254 |
| 5,121,273 A * | 6/1992 | Slezak | 360/264.2 |
| 6,176,734 B1 | 1/2001 | Juntwait et al. | |
| 6,215,315 B1 | 4/2001 | Maejima | |
| 6,320,835 B1 * | 11/2001 | Kamei | 720/653 |
| 6,487,048 B1 * | 11/2002 | Dunn | 360/245.9 |
| 6,594,117 B2 | 7/2003 | Dague et al. | |
| 6,941,974 B2 | 9/2005 | Utaki | |
| 7,223,919 B2 | 5/2007 | Gagne | |
| 2001/0010270 A1 * | 8/2001 | Lin et al. | 174/255 |
| 2003/0056367 A1 | 3/2003 | Reasoner et al. | |
| 2003/0085054 A1 * | 5/2003 | Ames et al. | 174/254 |
| 2008/0253028 A1 * | 10/2008 | Chang et al. | 360/244.3 |
| 2009/0266578 A1 * | 10/2009 | Price et al. | 174/117 FF |
| 2011/0069460 A1 * | 3/2011 | Clayton et al. | 361/749 |

OTHER PUBLICATIONS

Swart, R. "Bend Limiters Improve Cableimperformance", *Oceans*; vol. 9, (Jan. 6, 2003),304-312.

Zehnder, et al., "Reinforcing Effect of Coverlayers on the Fatigue Life of Copper-Kapton Flex Cables", *IEEE Transactions on Components, Packaging, and Manufacturing Technology—Part B*, vol. 18, No. 4 (Nov. 1995),704-708.

* cited by examiner

*Primary Examiner* — Son Mai

(57) ABSTRACT

A flex cable for a head stack assembly of a hard disk drive comprises a base film, a first adhesive layer coupled with the base film, and at least one interrogation trace and at least one signal trace coupled with the first adhesive layer. The interrogation trace is configured to be probed to measure a deterioration of electrical conductivity. The flex cable has a second adhesive layer that is coupled with the interrogation trace, the signal trace, and the first adhesive layer. The flex cable comprises a cover film coupled with the second adhesive layer.

20 Claims, 6 Drawing Sheets

FLEX CABLE FOR A HARD DISK DRIVE HAVING AN INTERROGATION TRACE

TECHNICAL FIELD

This subject matter relates generally to the field of flex circuits and in particular to a flex cable for a hard disk drive having an interrogation trace operable for checking damage to the flex cable.

BACKGROUND

Flex circuits are used to electrically couple components together such that relative motion between the components is made possible while maintaining electrical coupling. Relative motion between components can be desirable in either the operation of the components or in their assembly. If the relative motion provided by the flex circuit is required for the operation of the components, the flex cycles can be as much as several thousand to hundreds of millions of flex cycles. If relative motion is provided by the flex circuit to facilitate assembly, the number of flex cycles can be as few as one or two flex cycles.

A hard disk drive (HDD) uses several flex circuits, known as flex cables in the HDD industry, which facilitate assembly as well as provide electrical coupling of components during HDD operation which require relative motion of the coupled components. The assembling of components in an HDD typically involve several operations wherein the flex cable is subjected to bending and at times overstressing due to the flex cable inappropriately interacting with a test fixture or an assembly tool. Examples of such inappropriate interaction of the flex cable with a test fixture or an assembly tool can be: pinching, chafing, scraping, creasing, tearing, and the like. The overstressing can go undetected until the flex cable fails a test at a higher level of assembly. Higher levels of assembly have higher cost associated with them since more components and more labor have been introduced to the flex cable at the higher level of assembly. An overstressed flex cable discovered at a higher level of assembly incurs more cost than if the overstressed flex cable had been discovered at a lower level of assembly.

SUMMARY

Various embodiments of the present subject matter are described herein. A flex cable for a head stack assembly of a hard disk drive comprises a base film, a first adhesive layer coupled with the base film, and at least one interrogation trace and at least one signal trace coupled with the first adhesive layer. The interrogation trace is configured to be probed to measure a deterioration of electrical conductivity. The flex cable has a second adhesive layer that is coupled with the interrogation trace, the signal trace, and the first adhesive layer. The flex cable comprises a cover film coupled with the second adhesive layer.

BRIEF DESCRIPTION OF THE DRAWINGS

The accompanying drawings, which are incorporated in and form a part of this specification, illustrate embodiments of the subject matter and, together with the description, serve to explain the principles of the subject matter.

Figure 1:
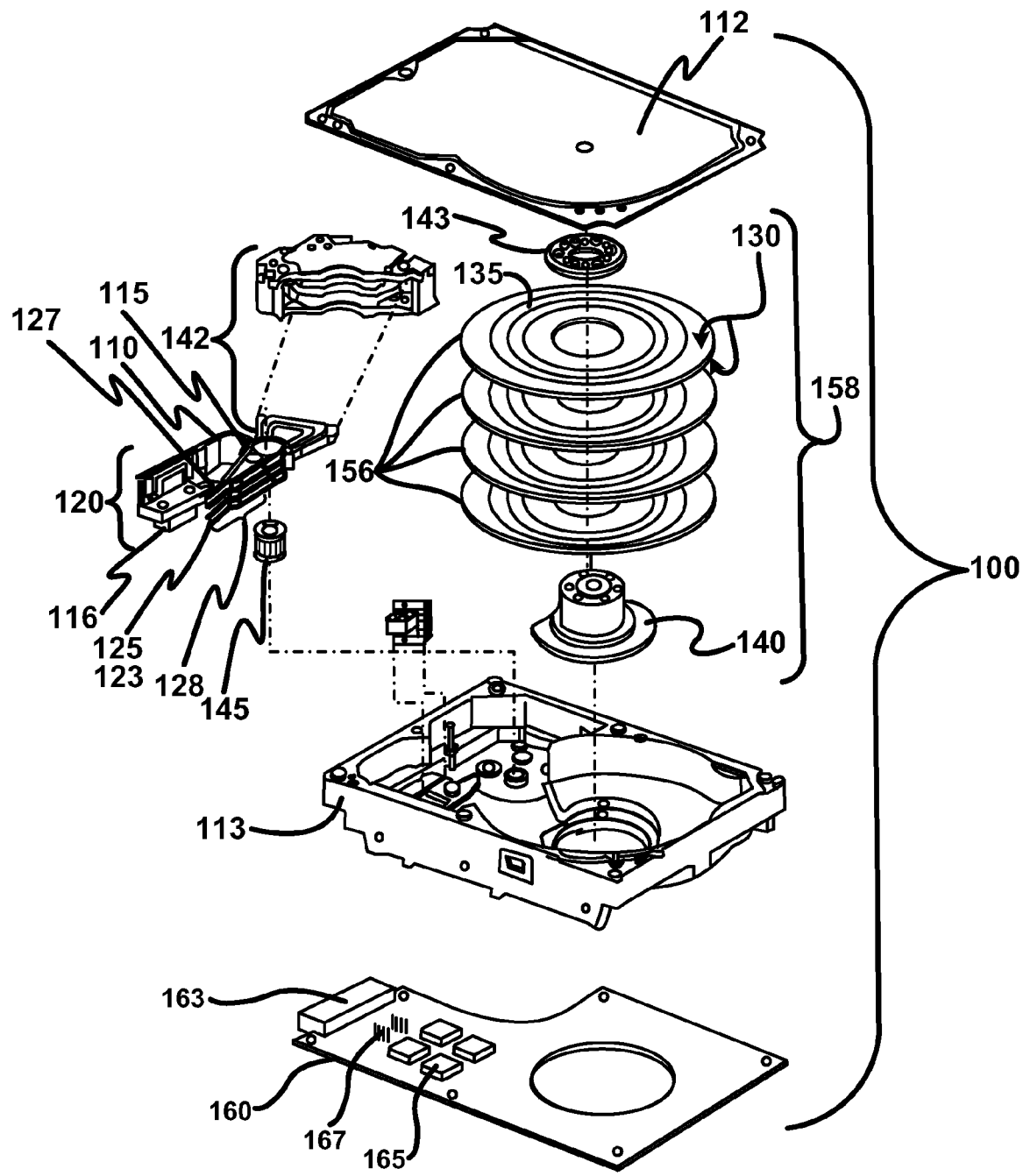
FIG. 1 is an isometric blow-apart of an HDD in accordance with one embodiment presented.

The drawings referred to in this description should not be understood as being drawn to scale except if specifically noted.

DETAILED DESCRIPTION

Reference will now be made in detail to the alternative embodiment(s) of the subject matter. While the subject matter will be described in conjunction with the alternative embodiment(s), it will be understood that they are not intended to limit the subject matter to these embodiments. On the contrary, the subject matter is intended to cover alternatives, modifications and equivalents, which may be included within the spirit and scope of the subject matter as defined by the appended claims.

Furthermore, in the following detailed description of embodiments of the present subject matter, numerous specific details are set forth in order to provide a thorough understanding of the present subject matter. However, it will be recognized by one of ordinary skill in the art that embodiments of the present subject matter may be practiced without these specific details. In other instances, well known methods, procedures, and components have not been described in detail as not to unnecessarily obscure aspects of the present subject matter.

Computers have become part of every day life, and as such, expectations and demands continually increase for greater speed for manipulating data, for holding larger amounts of data, for higher reliability, and for lower cost. To meet these demands for increased performance, the mechanical assembly in a computer, specifically the hard disk drive (HDD) has undergone many changes.

Reliability is a major concern for users of HDDs since users are trusting large amounts of data, personal information, and in some instances, the viability of their business to the continued performance of an HDD. To meet these expectations, HDD designers strive to design components and subassemblies in the HDD to function for long periods of time, more reliably, and without failure.

A device within the HDD, known as an actuator, moves a magnetic transducer rapidly across a disk surface during operation. A flex cable enables data to be transferred between the actuator and a PC card while the actuator is moving the magnetic transducer across the disk surface. The conductors within the flex cable are commonly known as traces. The flex cable also facilitates assembly of the actuator into the HDD by virtue of its flexible nature allowing the flex cable to be moved into positions that are intended to avoid damage of the traces due to inappropriate interaction of the flex cable with a test fixture or an assembly tool.

The flex cable can experience cracks in its traces during operation and assembly which can be exacerbated by pinching, chafing, scraping, creasing, tearing, and the like, caused by inappropriate interaction of the flex cable with a test fixture or an assembly tool. Embodiments presented enable detection of damage to the flex cable more easily, while avoiding the cost of added labor and added components to a flex cable assembly at a higher level of assembly.

The discussion will begin with a brief overview of a hard disk drive (HDD) which comprises a flex cable in accordance with presented embodiments for communicatively coupling an actuator assembly to a printed circuit board. The discussion will then focus on embodiments of the present subject matter by which an occurrence of damage can be detected in a flex cable. The implementation of embodiments of the present subject matter will then be discussed.

Overview

With reference to FIG. 1, an isometric blow-apart of HDD 100 is presented in accordance with an embodiment presented. Base casting 113 provides coupling points for components and subassemblies such as disk stack 158, voice coil motor (VCM) 142, and head stack assembly (HSA) 120. Disk stack 158 is coupled with base casting 113 by means of motor-hub assembly 140 and disk clamp 143. Motor-hub assembly 140 will have at least one disk 156 coupled with it such that disk 156 can rotate about an axis common to motor-hub assembly 140 and the center of disk 156. Disk 156 has at least one disk surface 130 upon which reside data tracks 135. HSA 120, at times referred to as an actuator assembly or carriage, comprises suspension 127, which suspends hard disk drive slider 125 next to disk surface 130, and HSA connector 116. Hard disk drive slider 125 is comprised of magnetic transducer 123 which reads and writes data to and from data tracks 135. Suspension 127 and hard disk drive slider 125 comprise head gimbal assembly (HGA) 128. Flex cable 110, which is part of actuator assembly 120, conveys data between HSA connector 116 and arm electronics (A/E) module 115. HSA connector 116 also conveys control data between printed circuit board (PCB) 160 and VCM 142.

HSA 120, hereafter referred to as actuator assembly 120, is coupled pivotally with base casting 113 by means of pivot bearing 145, such that VCM 142 can move HGA 128 with slider 125 arcuately across disk surface 130, accessing data tracks 135. Upon assembly of actuator assembly 120, disk stack 158, VCM 142, and other components with base casting 113, cover 112 is coupled with base casting 113 to enclose these components and subassemblies into HDD 100.

Once cover 112 is coupled with base casting 113, PCB 160 is coupled to base casting 113. PCB 160 comprises at least one electrical component 165 which in general performs the electrical tasks of HDD 100, such as status check of HDD 100 before writing data, power control for motor-hub assembly 140, and servo control of VCM 142. VCM 142 is electrically coupled with PCB 160 via HSA connector 116 and an appropriately mating connection 167 on PCB 160. Electrical coupling of HDD 100 to a host system in which HDD 100 operates is enabled in part through PCB connector 163, coupled to PCB 160.

Figure 2:
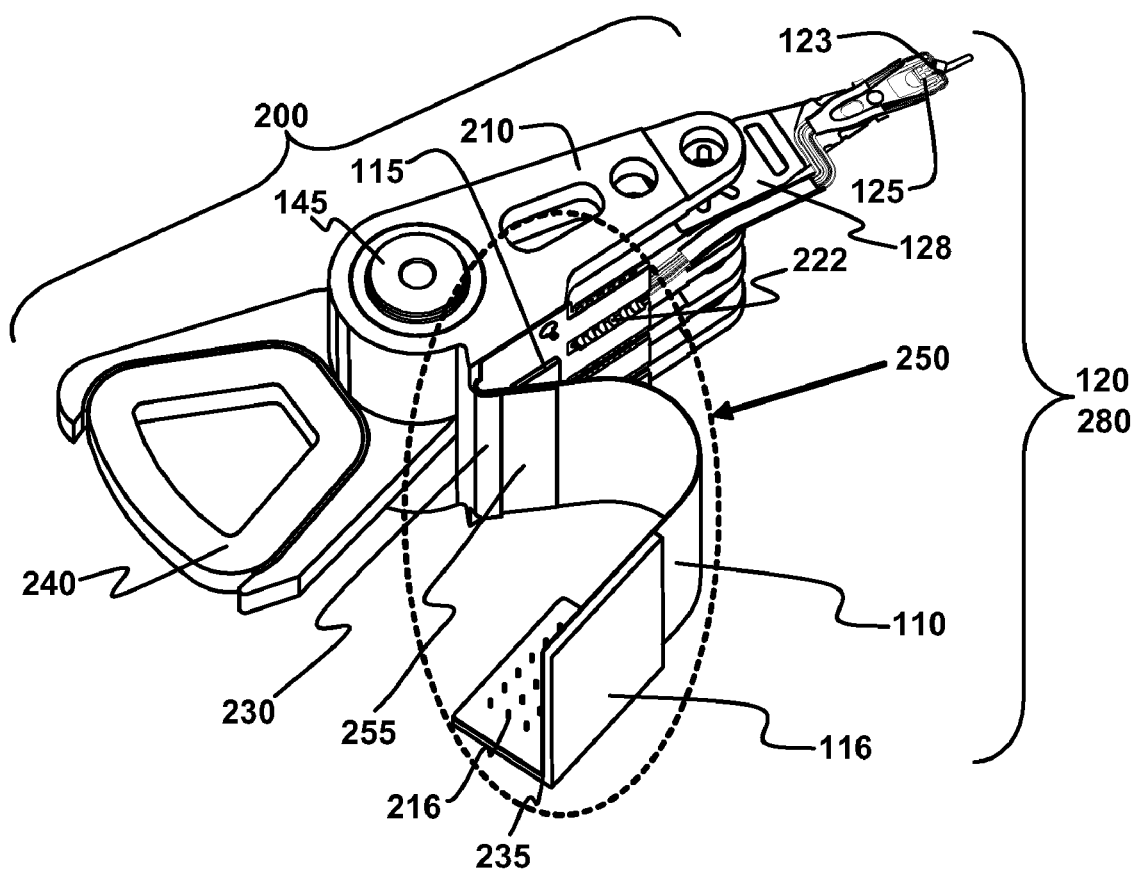
FIG. 2 is an isometric of an actuator assembly in accordance with one embodiment presented.

With reference to FIG. 2, the hierarchy of subassemblies and assemblies is defined as follows: Flex cable assembly 250 is a subassembly which can be coupled with comb 210. In general, flex cable assembly 250 comprises flex cable 110 for conducting data signals from actuator assembly 120 to HSA connector 116. Flex cable 110 is a component to which other components can be added, such as A/E module 115, HSA connector 116, constrained layer damper (CLD) 255, and coupler 230, wherein assembled comprises flex cable assembly 250. Comb assembly 200 is a subassembly which is operable to receiving at least one HGA 128. In general, comb assembly 200 comprises, comb 210, voice coil 240, and flex cable assembly 250. Coupling at least one HGA 128 with comb assembly 200 comprises actuator assembly 120. Coupling pivot bearing 145 with actuator assembly 120 comprises actuator 280.

Components can be interchanged or shared between subassemblies while maintaining the spirit of the definitions of the aforementioned assemblies and subassemblies. Embodiments of the present subject matter, and as presented in FIG. 2, are applicable to the aforementioned assemblies and subassemblies as well as HDD 100 in which flex cable 110 is a component.

Flex cable 110 is configured to convey data between HSA connector 116 and A/E module 115 while allowing actuator 280 to arcuately move across disk surface 130, accessing data tracks 135. During a normal life of HDD 100, flex cable 110 can undergo hundreds of millions of flex cycles. It is expected by users and designers of HDD 100, for flex cable 110 to flex and convey data between HSA connector 116 and A/E module 115 reliably and without failure due to damage from flex cable 110 having been pinched, chafed, scraped, creased, torn, and the like.

Physical Description

Figure 3:
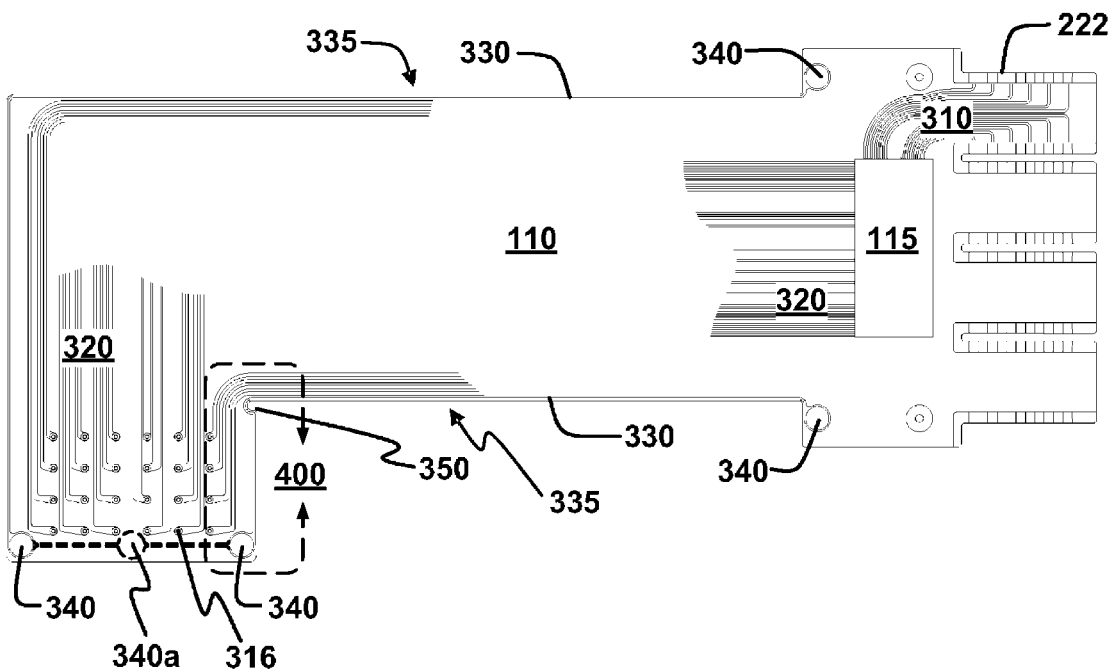
FIG. 3 is a plan view of a flex cable for an actuator in accordance with one embodiment presented.

With reference to FIG. 3, flex cable 110 is presented as a flat component with A/E module 115 coupled with flex cable 110 and prior to forming for coupling with HDD 100, in accordance with an embodiment presented. For the sake of brevity and clarity, only portions of a few flex cable traces (310, 320) of flex cable 110 are shown so as to not obscure embodiments of the present subject matter.

Termination 222 is configured to transmit data signals between flex cable 110 and HGA 128. Flex cable traces 310 are configured to transmit data signals between termination 222 and A/E module 115. A/E module 115 is configured to perform electronic manipulation of data signals, such as switching which HGA 128 is to read or write data signals, amplification of read data signals, driving write current to magnetic transducer 123, and the like. Flex cable traces 320 are configured to transmit data signals between A/E module 115 and connector 116. Connector 116 comprises pins 216 which are configured to couple with connector pin via 316 at a distal end of flex cable traces 320. In so coupling, flex cable 110 is capable of transmitting data signals to and from magnetic transducer 123, to and from A/E module 115, to and from connector 116 and (beyond HDD 100) to and from a host system.

In accordance with an embodiment presented, flex cable 110 comprises an interrogation trace 330 running parallel to at least one signal trace 320 and edge 335 of flex cable 110. Edge 335 is an outermost edge of flex cable 110 which comprises the perimeter of flex cable 110. Interrogation trace 330 has two distal ends and probe via 340 at each distal end. A via is defined in the art of flex cables as an opening in one layer that allows access to another layer in the flex cable. In accordance with another embodiment, interrogation trace 330 is routed parallel and approximately coinciding with edge 335 of flex cable 110 and comprises probe via 340 at each distal end and an intermediate probe via 340a between each distal end of interrogation trace 330.

Flex cable 110 may have a corner such as corner 350 presented in FIG. 3, that is operable to receiving a bend such as bend 235, upon assembly into flex cable assembly 250 as presented in FIG. 2. Flex cable 110 is prone to being damaged during a forming process such as the forming process for effecting bend 235. Flex cable edge 335 is also prone to damage during the manufacturing processes for: flex cable assembly 250, actuator assembly 120, actuator 280, and HDD 100. In accordance with an embodiment presented, flex cable 110 comprises an interrogation trace, such as interrogation trace 330 that coincides with an area of flex cable 110 that is to be subsequently bent in a process such as that which forms bend 235.

Figure 4:
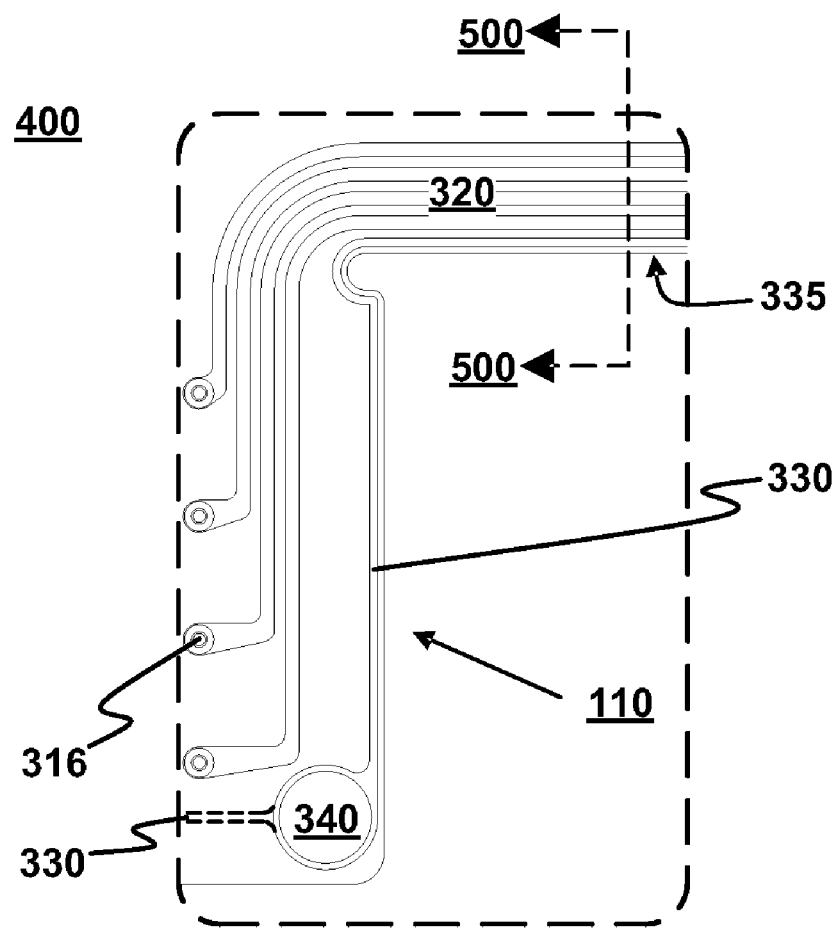
FIG. 4 is a detail of a plan view of a flex cable for an actuator in accordance with one embodiment presented.

With reference to FIG. 4 and in accordance with an embodiment presented, detail 400 of flex cable 110 is presented to more clearly show connector pin via 316, signal traces 320, interrogation trace 330, and probe via 340. Cross-section 500 passes through a typical portion of flex cable 110 comprising signal traces 320 and interrogation trace 330.

Figure 5:
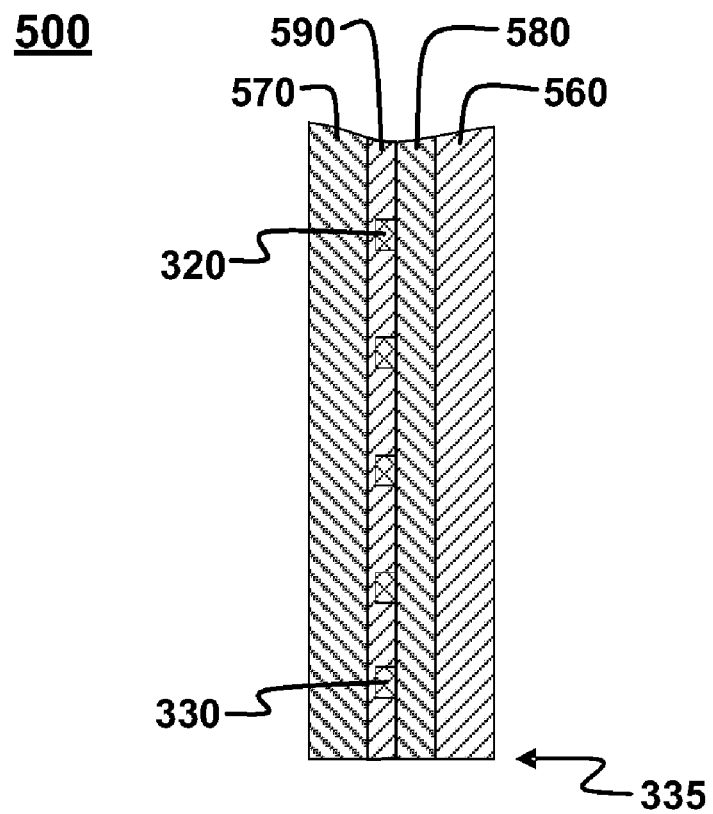
FIG. 5 is a cross-section of a flex cable in accordance with one embodiment presented.

With reference to FIG. 5 and in accordance with an embodiment presented, cross-section 500 of flex cable 110 is presented. Flex cable 110 comprises base film 560, cover film 570, first adhesive layer 580, and second adhesive layer 590. Base film 560 and cover film 570 comprise the outer most layers of flex cable 110. Adhered to base film 560 and cover film 570 are first adhesive layer 580 and second adhesive layer 590 respectively. Adhered to both first adhesive layer 580 and second adhesive layer 590 are at least one signal trace 320 and at least one interrogation trace 330. Second adhesive layer 590 is coupled with first adhesive layer 580. Interrogation trace 330 is configured to be probed to measure a deterioration of electrical conductivity. A via, such as probe via 340 presents a configuration of interrogation trace 330 that allows access to interrogation trace 330 for measuring a deterioration of electrical conductivity.

In accordance with an embodiment presented, base film 560 and cover film 570 are chosen from a group of plastics known for their compatibility with the environment of HDD 100, for their manufacturability, and for their specific stiffness and flexibility. Examples of plastics in this group are: polyimide and polyester, commonly available from DuPont Corporation as KAPTON and MYLAR; and UPILEX, commonly available from Ube Industries. Signal trace 320 and interrogation trace 330 comprise copper or an alloy of copper such as Cu—Ni—Si—Mg, Be—Cu—Ni, and Cu—Ti. In accordance with another embodiment presented, signal trace 320 and interrogation trace 330 comprise a non-copper conductor such as aluminum, carbon, silver ink, INCONEL, and constantan.

In accordance with an embodiment presented, probe via 340 is operable to probing interrogation trace 330 for electrical conductivity. Through experimentation a correlation is established for a deterioration of electrical conductivity of interrogation trace 330 and a severity of damage of flex cable 110. The majority of damage to flex cable 110 begins at edge 335 and propagates into trace (330, 320). A physical change in interrogation trace 330 such as a nick, tear, crack, and thinning from being smashed or stretched, which typically results from damage, will change conductivity of interrogation trace 330, i.e. deteriorate the electrical conductivity. Since interrogation trace 330 is between edge 335 and signal trace 320, a deterioration of electrical conductivity in interrogation trace 330 will portend damage to signal trace 320.

Embodiments presented of the subject matter are applicable to all levels of assembly and subassembly as presented in FIG. 1 and FIG. 2, such as flex cable assembly 250, actuator assembly 120, actuator 280, and HDD 100.

Operation

Figure 6:
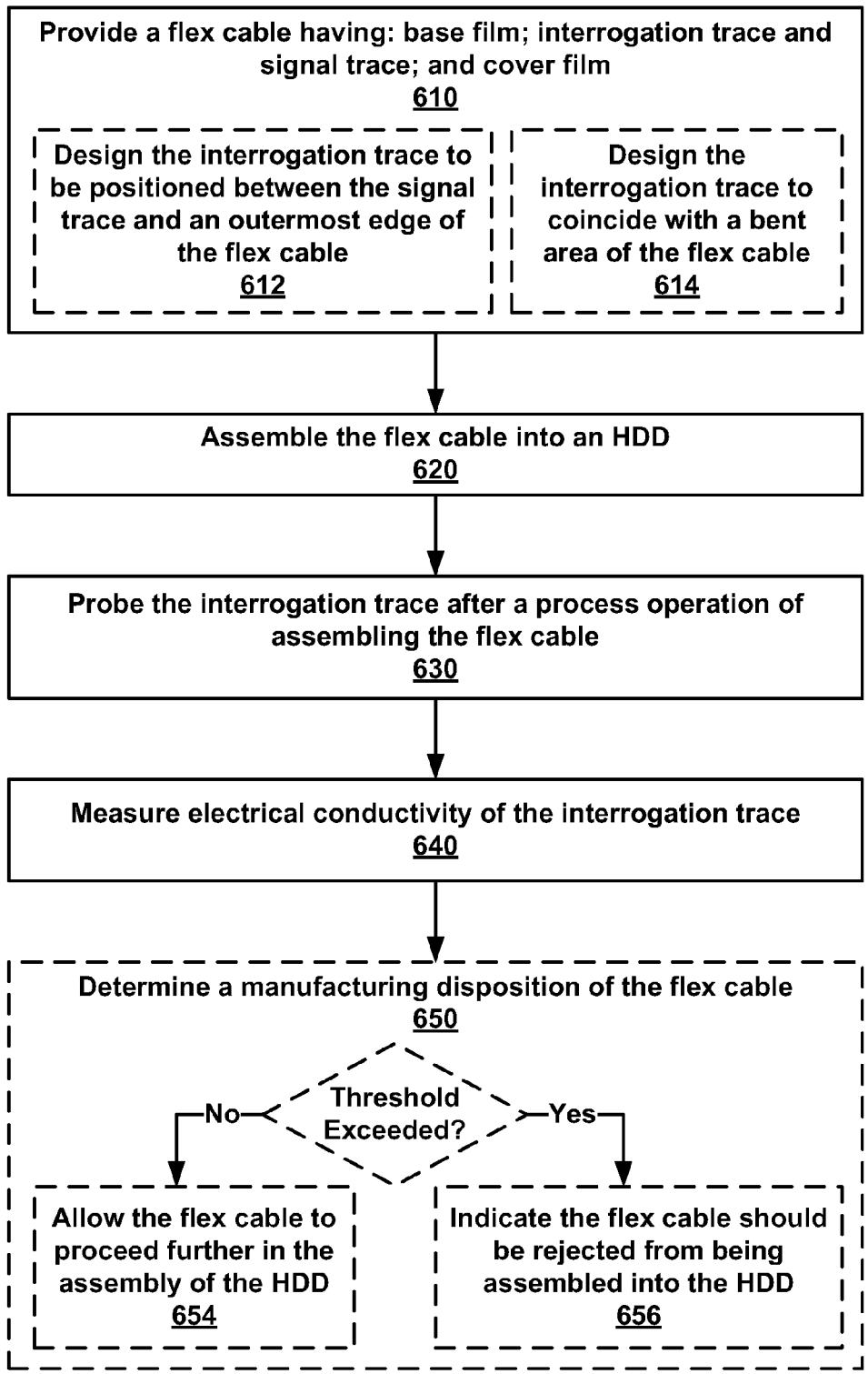
FIG. 6 is a flow chart illustrating a process for monitoring damage in a flex cable during the assembly of an HDD in accordance with one embodiment presented.

FIG. 6 is a flow chart illustrating a process 600 for monitoring damage in a flex cable, such as flex cable 110, in accordance with one embodiment presented. In one embodiment, process 600 is carried out by processors and electrical components under the control of computer readable and computer executable instructions. The computer readable and computer executable instructions reside, for example, in data storage features such as computer usable volatile and non-volatile memory. However, the computer readable and computer executable instructions may reside in any type of computer readable medium. Although specific components are disclosed in process 600, such components are examples of components for carrying out process 600. That is, the embodiments of the present subject matter are well suited to performing various other components or variations of the components recited in FIG. 6. Within the present embodiment, it should be appreciated that the components of process 600 may be performed by software, by hardware, by an assembly mechanism, through human interaction, or by any combination of software, hardware, assembly mechanism, and human interaction.

Process 600 will be described with reference to elements shown in FIG. 2 through FIG. 5.

In one embodiment, as shown at element 610 of process 600, a flex cable such as flex cable 110 is provided to process 600. Providing a flex cable, such as flex cable 110 comprises fabricating flex cable 110 having: base film 560, at least one interrogation trace 330 and at least one signal trace 320, cover film 570, and at least one probe via (340, 340a). Providing a flex cable, such as flex cable 110 also comprises procuring flex cable 110 having: base film 560, at least one interrogation trace 330 and at least one signal trace 320, cover film 570, and at least one probe via 340. Providing a flex cable, such as flex cable 110 also comprises supplying flex cable 110 having: base film 560, at least one interrogation trace 330 and at least one signal trace 320, cover film 570, and at least one probe via 340. Providing a flex cable, such as flex cable 110 also comprises assembling flex cable 110 having: base film 560, at least one interrogation trace 330 and at least one signal trace 320, cover film 570, and at least one probe via 340, into flex cable assembly 250, actuator assembly 120, and actuator 280.

In another embodiment, as shown at element 612 of process 600, a flex cable such as flex cable 110, is designed with interrogation trace 330 positioned between signal trace 320 and an outermost edge 335 of flex cable 110. In so doing, interrogation trace 330 is configured to receive potential damage, such as a pinch, chafe, scrape, crease, tear, and the like to flex cable 110 prior to signal trace 320 receiving such damage.

In another embodiment, as shown at element 614 of process 600, a flex cable such as flex cable 110, is designed with interrogation trace 330 coinciding with an area of flex cable 110 that is bent such as bend 235. In so doing, interrogation trace 330 is configured to receive potential damage from a forming process such as the forming process for effecting bend 235, prior to signal trace 320 receiving such damage.

In one embodiment, as shown at element 620 of process 600, a flex cable such as flex cable 110 is assembled into an HDD such as HDD 100. The HDD level of assembly is a very expensive point in the assembly process to discover a problem such as a damaged signal trace 320. It is more economic to detect a problem such as a damaged signal trace 320 at a lower level assembly in the HDD assembly process, such as at flex cable assembly 250, actuator assembly 120, and actuator 280.

In one embodiment, as shown at element 630 of process 600, an interrogation trace such as interrogation trace 330 of flex cable 110 is probed after at least one process operation of assembling flex cable 110, such as an operation performed at flex cable assembly 250, actuator assembly 120, and actuator 280. There are many forming, bending, coupling, and testing operations performed during assembly of flex cable assembly 250, actuator assembly 120, and actuator 280. These are well known and understood by one of ordinary skill in the art and for the sake of brevity and clarity will not be described.

In one embodiment, as shown at element 640 of process 600, electrical conductivity of an interrogation trace such as interrogation trace 330 of flex cable 110 is measured after at least one process operation of assembling flex cable 110, thereby monitoring flex cable 110 for damage occurring at a process operation for assembling flex cable 110. Probe via 340 allows access to interrogation trace 330 through cover film 570 and/or base film 560. Interrogation trace 330 comprises at least one probe via 340 at each distal end of interrogation trace 330. In accordance with another embodiment, interrogation trace 330 is routed parallel and approximately coinciding with edge 335 of flex cable 110 and comprises probe via 340 at each distal end and an intermediate probe via 340a between each distal end of interrogation trace 330.

In another embodiment of process 600, element 650 determines a manufacturing disposition of flex cable 110 based upon a likelihood of flex cable 110 failing from damage at a subsequent level of assembly, such as flex cable assembly 250, actuator assembly 120, actuator 280, and HDD 100. The likelihood of flex cable 110 failing from damage at a subsequent level of assembly is derived from experimentation that correlates the electrical conductivity from element 640 of process 600 and the amount of damage to interrogation trace 330. Experimentation enables the calculation of probability for additional damage being experienced at a subsequent level of assembly. The manufacturing disposition of flex cable 110 is for example: process flex cable 110 manually to avoid further damage; change the process where damage to flex cable 110 is occurring; start more flex cables through a process to compensate for a likelihood of flex cables failing from damage at a subsequent level of assembly; and the like.

In another embodiment, as shown at element 654 of process 600, a flex cable such as flex cable 110 is allowed to proceed further in the assembly of an HDD, such as HDD 100, when an electrical conductivity from element 640 is within an acceptable range. The electrical conductivity of interrogation trace 330 can indicate damage to interrogation trace 330. From experimentation, an electrical conductivity range indicates an acceptable amount of damage going into an assembly process for a subsequent level of assembly such as flex cable assembly 250, actuator assembly 120, and actuator 280, by understanding the likelihood of additional damage, and change in electrical conductivity of interrogation trace 330, which can occur at a subsequent level of assembly.

In another embodiment, as shown at element 656 of process 600, a flex cable such as flex cable 110 is indicated as exceeding a threshold of electrical conductivity, as measured at element 640, and therefore should be rejected for use in the assembly of an HDD such as HDD 100. A threshold for an operation is based upon experimentation that identifies the likelihood and/or probability of damage occurring at a subsequent operation. If a process for assembling a flex cable, such as flex cable 110, is stable and not changing, then the threshold for electrical conductivity measured at element 640 does not change. If a process for assembling a flex cable, such as flex cable 110, is not stable and varies in the damage indicated by electrical conductivity, then the threshold for electrical conductivity measured at element 640 changes accordingly.

The present subject matter, in the various presented embodiments avoids cost in an HDD assembly process by detecting damage in a flex cable, and determining the likelihood that the damage will become worse as the flex cable proceeds through the HDD assembly process. Damage to a flex cable is difficult and time consuming to detect by visual inspection. Visual inspection may not detect a damaged trace, such as an overstressed condition or micro-crack that could become a broken trace as the flex cable proceeds to subsequent operations in the HDD assembly process. The various embodiments presented enable an automatable method of detecting a damaged trace before it becomes a broken trace and before the flex cable incurs more manufacturing cost through subsequent operations wherein the flex cable may be rejected. A damaged condition of a trace becomes a numerical value based upon electrical conductivity rather than a judgment of damage based upon the appearance of a trace.

The foregoing descriptions of specific embodiments of the present subject matter have been presented for purposes of illustration and description. They are not intended to be exhaustive or to limit the subject matter to the precise forms disclosed, and many modifications and variations are possible in light of the above teaching. The embodiments described herein were chosen and described in order to best explain the principles of the subject matter and its practical application, to thereby enable others skilled in the art to best utilize the subject matter and various embodiments with various modifications as are suited to the particular use contemplated. It is intended that the scope of the subject matter be defined by the Claims appended hereto and their equivalents.

What is claimed is:

1. A flex cable for a head stack assembly of a hard disk drive, said flex cable comprising:
   a base film;
   a first adhesive layer coupled with said base film;
   at least one interrogation trace and at least one signal trace coupled with said first adhesive layer, wherein said interrogation trace is configured for probing to measure a deterioration of electrical conductivity;
   a second adhesive layer coupled with said interrogation trace, said signal trace, and said first adhesive layer; and
   a cover film coupled with said second adhesive layer.

2. The flex cable of claim 1 wherein said interrogation trace is between said at least one signal trace and an outermost edge which comprises the perimeter of said flex cable.

3. The flex cable of claim 1 wherein said interrogation trace coincides with an area of said flex cable that is to be subsequently bent.

4. The flex cable of claim 1 wherein said cover film comprising at least one via for facilitating access to electrically probe said interrogation trace.

5. The flex cable of claim 1 wherein said interrogation trace is selected from the group of non-copper conductors consisting of: aluminum, carbon, silver ink, INCONEL, and constantan.

6. The flex cable of claim 1 wherein said interrogation trace and said signal trace comprise copper.

7. The flex cable of claim 1 wherein said deterioration of electrical conductivity corresponds to a severity of damage of said flex cable.

8. A hard disk drive comprising:
   a flex cable communicatively coupling an actuator assembly to a printed circuit board, said flex cable having:
   a base film;
   a first adhesive layer coupled with said base film;
   at least one interrogation trace and at least one signal trace coupled with said first adhesive layer, wherein said interrogation trace is configured for probing to measure a deterioration of electrical conductivity;
   a second adhesive layer coupled with said interrogation trace, said signal trace, and said first adhesive layer; and
   a cover film coupled with said second adhesive layer.

9. The hard disk drive of claim 8 wherein said interrogation trace of said flex cable is between said at least one signal trace and an outermost edge which comprises the perimeter of said flex cable.

10. The hard disk drive of claim 8 wherein said interrogation trace of said flex cable coincides with an area of said flex cable that is bent.

11. The hard disk drive of claim 8 wherein said cover film of said flex cable comprises at least one via for facilitating access to electrically probe said interrogation trace.

12. The hard disk drive of claim 8 wherein said base film and said cover film of said flex cable are selected from the group of polymers consisting of: polyimide, UPILEX, KAPTON, polyester, and MYLAR.

13. The hard disk drive of claim 8 wherein said interrogation trace and said signal trace of said flex cable comprise copper.

14. The hard disk drive of claim 8 wherein said deterioration of electrical conductivity of said flex cable corresponds to a severity of damage of said flex cable.

15. A method of monitoring damage in a flex cable during the assembly of a hard drive, said method comprising:
    providing a flex cable having:
        a base film;
        at least one interrogation trace and at least one signal trace; and
        a cover film having at least one via for probing said interrogation trace, assembling said flex cable into a hard disk drive;
    probing said interrogation trace after at least one process operation of said assembling of said flex cable; and
    measuring electrical conductivity of said interrogation trace to monitor for damage in said flex cable.

16. The method as recited in claim 15, further comprising:
    determining a manufacturing disposition of said flex cable based upon a likelihood of said flex cable failing from damage at a subsequent level of assembly based on said electrical conductivity.

17. The method as recited in claim 15 wherein said providing said flex cable comprising:
    designing said interrogation trace to be positioned between said signal trace and an outermost edge which comprises the perimeter of said flex cable.

18. The method as recited in claim 15 wherein said providing said flex cable comprising:
    designing said interrogation trace to coincide with an area of said flex cable that is bent.

19. The method as recited in claim 16 wherein said determining a manufacturing disposition of said flex cable comprising:
    allowing said flex cable to proceed further in the assembly of said hard disk drive when an electrical conductivity during said measuring is within an acceptable range.

20. The method as recited in claim 16 wherein said determining a manufacturing disposition of said flex cable comprising:
    indicating said flex cable should be rejected for use in the assembly of said hard disk drive when an electrical conductivity threshold is exceeded during said measuring.

* * * * *